(12) United States Patent
Sullaj

(10) Patent No.: US 9,407,021 B2
(45) Date of Patent: Aug. 2, 2016

(54) COMPOUND CYLINDER PCB CONNECTION

(71) Applicant: Continental Automotive Systems, Inc., Auburn Hills, MI (US)

(72) Inventor: Blendi Sullaj, Saint Clair Shores, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 405 days.

(21) Appl. No.: 14/142,898

(22) Filed: Dec. 29, 2013

(65) Prior Publication Data

US 2015/0188247 A1 Jul. 2, 2015

(51) Int. Cl.
| | |
|---|---|
| *H01R 12/70* | (2011.01) |
| *H01R 43/02* | (2006.01) |
| *H01R 4/60* | (2006.01) |
| *H01R 12/52* | (2011.01) |
| *H01R 12/55* | (2011.01) |
| *H01R 12/73* | (2011.01) |
| *H05K 1/14* | (2006.01) |
| *H01R 12/58* | (2011.01) |

(52) U.S. Cl.
CPC ............ *H01R 12/7082* (2013.01); *H01R 4/60* (2013.01); *H01R 12/523* (2013.01); *H01R 12/55* (2013.01); *H01R 12/73* (2013.01); *H01R 43/0256* (2013.01); *H05K 1/144* (2013.01); *H01R 12/585* (2013.01); *H05K 2201/042* (2013.01); *H05K 2201/2036* (2013.01); *Y10T 29/49147* (2015.01); *Y10T 29/49149* (2015.01)

(58) Field of Classification Search
CPC ..... H01R 12/70; H01R 12/7082; H01R 43/02
USPC .......... 174/255, 262, 263–266; 361/792, 785, 361/790, 803
See application file for complete search history.

(56) References Cited

U.S. PATENT DOCUMENTS

| | | | |
|---|---|---|---|
| 4,652,842 A | 3/1987 | Kling et al. | |
| 4,813,128 A | 3/1989 | Massopust | |
| 6,097,599 A | 8/2000 | Jocham et al. | |
| 7,466,562 B2 * | 12/2008 | Gilliland | ............ G01R 31/2808 361/803 |
| 2003/0214370 A1 * | 11/2003 | Allison | ................ H03H 1/0007 333/182 |
| 2008/0144301 A1 * | 6/2008 | Konishi | ................. H01R 12/58 361/803 |

(Continued)

FOREIGN PATENT DOCUMENTS

| | | |
|---|---|---|
| DE | 102005058089 A1 | 6/2007 |
| EP | 0825680 A2 | 2/1998 |

(Continued)

OTHER PUBLICATIONS

Search Report dated Jul. 31, 2014, from corresponding GB Patent Application No. GB1401609.1.

*Primary Examiner* — Jenny L Wagner
*Assistant Examiner* — Michael P McFadden

(57) ABSTRACT

A integrated mechanical and electrical connector and method for connecting printed circuit boards and an connected printed circuit board assembly is disclosed. The connector comprises an outer member defining a first bore, and an inner member at least partially disposed within the first bore wherein the inner member is in an interference fit relationship with the outer member at the periphery of the first bore and wherein the inner member is an electric conductor, the connector being configured to be mechanically and electrically connected to a printed circuit board by at least one of solder reflow, wave soldering and press fitting.

17 Claims, 2 Drawing Sheets

(56) References Cited

U.S. PATENT DOCUMENTS

2009/0194884 A1* 8/2009 Stolze .................. H01L 25/072
                                                      257/773
2011/0130053 A1  6/2011 Emde et al.
2013/0104394 A1* 5/2013 Hardin .................... H01G 4/33
                                                      29/832

FOREIGN PATENT DOCUMENTS

| GB | 1440122 A | 6/1976 |
| JP | H03272575 A | 12/1991 |
| WO | 90/15478 A2 | 12/1990 |
| WO | 01/06821 A1 | 1/2001 |

* cited by examiner

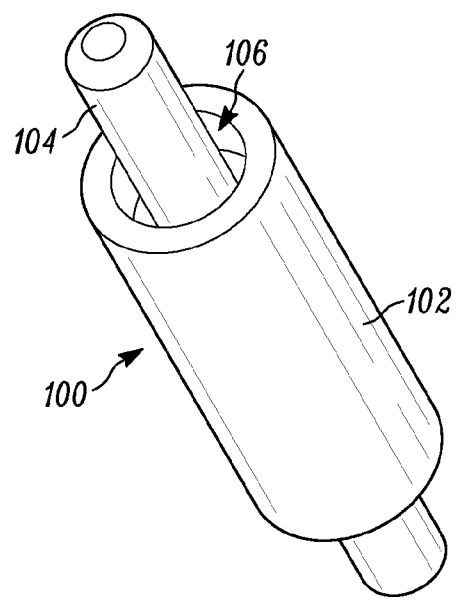
FIG. 1
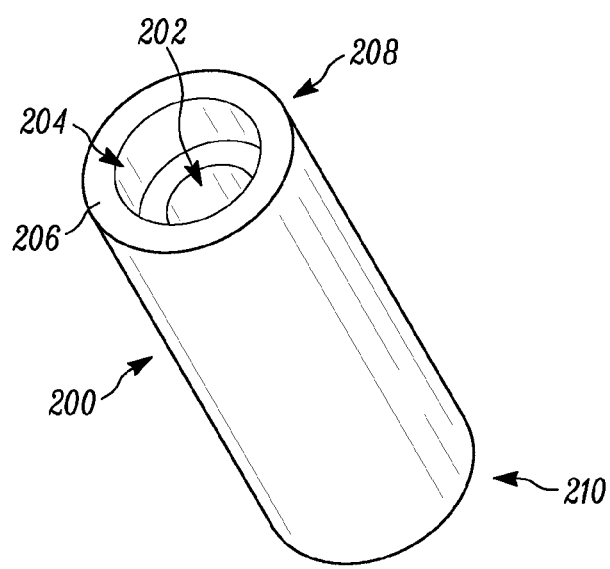 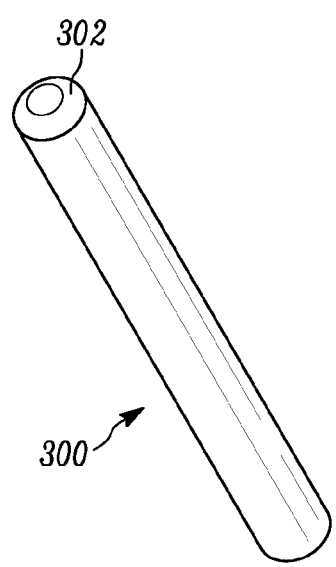
FIG. 2 FIG. 3

COMPOUND CYLINDER PCB CONNECTION

BRIEF DESCRIPTION OF THE DRAWINGS

For a more complete understanding of the disclosure, reference should be made to the following detailed description and accompanying drawings wherein:

FIG. 1 comprises a schematic pictorial view of an exemplary assembled connector;

FIG. 2 comprises a schematic pictorial view of an exemplary outer member of the connector;

FIG. 3 comprises a schematic pictorial view of an exemplary inner member of the connector;

Figure 4:
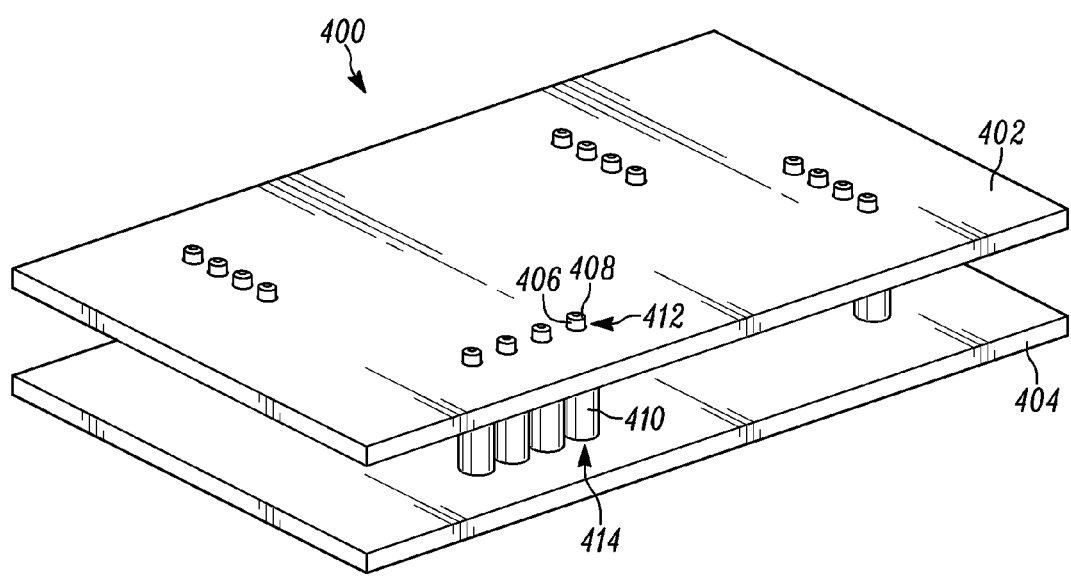
FIG. 4 comprises a schematic pictorial view of an exemplary assembled connector interconnecting two printed circuit boards.

Skilled artisans will appreciate that elements in the figures are illustrated for simplicity and clarity and have not necessarily been drawn to scale. For example, the size dimensions and/or relative positioning of some of the elements in the figures may be exaggerated relative to other elements to help to improve understanding of various aspects of the present invention. Also, common but well-understood elements that are useful or necessary in a commercially feasible embodiment are often not depicted in order to facilitate a less obstructed view of these various aspects of the present invention. Furthermore, it will be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Many electrical and electronic devices comprise multiple printed circuit boards ("PCBs"), which are electrically and structurally connected to each other. Such structural and electrical connections are sometimes standalone, each respectively generally providing a mechanical connection function or an electrical connection function. At other times, the structural and electrical connection functions are integrated in an integrated connector.

Some of the integrated connectors comprise electrically conductive pins partially encased in a molded resin body. However production of such connectors involves the use of unique resin molding and pin forming equipment, such as, for example, stamping presses with customized dies. Moreover, in many instances the installation of such connectors requires the use of specialized press pin technology process and tooling or the use of relatively expensive temperature resistant resins in the connector body to withstand the temperatures encountered during soldering. For example, the reflow soldering process sometimes exposes electronic assemblies to temperatures in the range of about 260° C. or more. Accordingly, an alternative connector, system and method for connecting PCBs is disclosed and described.

With reference to FIG. 1, in an aspect the connector 100 comprises an outer 102 and an inner 104 member. With reference to FIGS. 2 and 3 and continued reference to FIG. 1., in an example the outer member 102, 200 is substantially an open right circular cylinder with an annular cross section, thus defining a circular cylindrical first bore 202 configured to receive a circular cylindrical inner member 104, 300 at least partially in the first bore 202. However, in other examples the outer member 200 and the inner member 300 may take other suitable shapes, for example, non-circular cylinder, polyhedron, ellipsoid or otherwise. Similarly, the first bore 202 may be defined by other suitable shapes, for example, non-circular cylinder, polyhedron, ellipsoid or otherwise. Furthermore, although in an example the outer shapes of the inner 300 and outer 200 members and the shape defining the first bore 202 are similar to each other, the outside shapes of the inner 300 and outer 200 members and the shape defining the first bore 202 in other examples may but need not be similar to each other. For example, the outer member 200 may resemble a parallelepiped with a right circular cylindrical first bore 202 and the inner member 300 may resemble a prism. Moreover, the disclosure contemplates that suitable shapes may be chosen to enhance or maximize certain properties of the connector 100, such as, for example, electrical conduction, thermal conduction, thermal radiation, convection, surface area, rigidity, or otherwise.

With reference to FIGS. 2 and 3, in an aspect the outer member 200 is configured to receive an inner member 300, the inner member 300 having at least partially larger cross section than the cross section of the first bore 202. In an example the outer member 200 is configured to receive the inner member 300 through the use of at least one of press fit and shrink fit technology.

With continued reference to FIGS. 2 and 3 and renewed reference to FIG. 1, in an aspect the inner member 104, 300 is at least partially inserted into the first bore 202. In an example the inner member 104, 300 is at least partially inserted into the first bore 202 through the use of at least one of press fit and shrink fit technology.

In an aspect the inner member 104, 300 is longer than the outer member and is configured to protrude beyond two ends 208, 210 of the outer member 102, 200 when assembled into the connector 100. However, the disclosure contemplates examples where the inner member 104, 300 is of the same length or shorter than the outer member 102, 200 and where the inner member 104, 300 protrudes beyond more or less than two ends of the outer member 102, 200, for example beyond one, three, or more sides of the outer member 102, 200.

With reference to FIG. 4 and continued reference to FIG. 3, in an aspect, at least one end section of the inner member 300, 406 is configured to engage at least one PCB 402, 404. In an example at least one end section of the inner member 300, 406 is configured to penetrate through at least one surface of a PCB 402, 404. In an example the inner member is configured to penetrate through at least one surface of a PCB 402, 404 by defining a taper 302, 408 at least one end. However, the disclosure also contemplates an inner member configured to penetrate two or more PCB surfaces of one or more PCBs 402, 404. Also, the disclosure contemplates inner members 300, 406 where at least one end section of the inner member is configured to come in proximity to at least one surface of at least one PCB 402, 404. In an example at least one of the end sections of the inner member 300, 406 is configured to be press fitted into a PCB 402, 404. However, the disclosure also contemplates examples where at least one of the end sections of the inner member 300, 406 is configured to pass through a bore 412 in a PCB 402, 404 and examples where at least one of the end sections of the inner member 300, 406 is configured to be soldered to at least one PCB 402, 404. In an example the inner member 300, 406 is at least partially plated, for example at least one of the end sections is plated, the middle section is plated, or the entire inner member 300, 406 is plated.

With reference to FIGS. 1 and 2, in an aspect the outer member 102, 200 is configured to receive solder. In an example the outer member is configured to receive solder into a second bore 106, 204 adjacent to the inner member 104. However, the disclosure also contemplates outer members configured to receive solder at locations other than the bore adjacent to the inner member, for example at a terminal surface of the outer member 206, or otherwise. In an example the outer member is at least partially wettable by solder or otherwise configured to be soldered to at least one PCB. However, the disclosure also contemplates outer members that are not wettable by solder and outer members that are not solderable.

In an aspect the inner and outer members comprise different materials. In an example the inner member 104, 300 comprises copper, or another suitable material, such as for example an electric conductor, a thermal conductor, a structurally rigid material, or otherwise. In an example the outer member 102, 200 comprises steel, or another suitable material different than that of the inner member 104, 300, such as for example an electric conductor, a thermal conductor, a structurally rigid material, or otherwise. However, the disclosure also contemplates the inner member 104, 300 and the outer member 102, 200 comprising the same material, for example copper, and different materials from the same categories, such as, for example, an electric conductor, a thermal conductor, a structurally rigid material, or otherwise.

With reference to FIGS. 1-3, in an example a connector 100 is assembled according to the following method. The outer member 200 is brought to a temperature to achieve expansion of the first bore 202 adequate to insert the inner member 300 into the first bore 202. Alternatively, the inner member 300 is brought to a temperature to achieve contraction of the inner member 300 adequate to insert the inner member 300 into the first bore 202. The disclosure also contemplates bringing both the inner 300 and the outer 200 members to temperatures suitable to achieve respective contraction and expansion of the respective inner and outer members adequate in combination to insert the inner member 300 into the first bore 202. Once sufficient expansion and/or contraction is achieved, the inner member 300 is inserted into the first bore 202. Upon insertion of the inner member 104, 300 into the outer member 102, 200 the assembled connector 100 is brought to atmospheric temperature and the respective expansion and/or contraction of the respective members leads to compressive contact between the two components.

In an aspect the inner member 104, 300 is mechanically pressed into the outer member 102, 200 when the members are at substantially the same temperature.

With reference to FIGS. 2-4, in an example the inner member 300, 406 is configured near at least one end with a taper 302, 408 to facilitate pressing into the outer member 200 or insertion into or through a PCB 402, 404.

In summary, the inner member 300 can be pressed into the outer member 200 or inserted into the outer member 200 via shrink fit or other suitable technology that places the inner member 300 at least partially in an interference fit relationship with the outer member 200 at the periphery of first bore 202. However, other suitable methods of assembling the connector 100 may also be used without departing from the spirit of the invention.

After assembly, the connectors 100, 414 may be used as electrical and mechanical connections for printed circuit boards 402, 404. For example, the outer member 410 serves as restraining component for the inner member 406; serves as support for at least one and preferably two or more, circuit boards 402, 404; serves as heat sink, if desirable; is round, rectangular or any other suitable shape; is of the same or different material from the inner member; optionally defines second bore 204 (e.g. groove or core out) in proximity of a PCB interface surface 206 to accommodate solder to facilitate soldering, such as, for example, reflow; and serves as electrical connection, if desirable, for example by being soldered to a PCB 402, 404 pad. Also, the inner member 406 serves as mechanical retention of at least one PCB 402, 404, and preferably between two or more PCBs 402, 404; being conductive, serves as electrical connection to at least one PCB 402, 404, and preferably between two or more PCBs 402, 404; serves as heat sink, if desirable; can be soldered or pressed into at least one PCB 402, 404, and preferably two or more PCBs 402, 404; and is partially or fully plated or un-plated, as desirable.

In an aspect the connector 414 can be placed on a PCB 402, 404 by hand or automated pick and place (grippers, vacuum, etc.) processes. Moreover, the connector 414 can be pressed into one PCB 402 and then another PCB 404 can be pressed over. Furthermore, the connector 414 can be placed on one PCB 402 and another PCB 404 can be placed on a free end of the connector 414 and the assembly can be reflowed. Also, the connector 414 can be placed into one PCB 402 and wave soldered then another PCB 404 can be placed onto a free end of the connector 414 and wave soldered. The disclosure also contemplates using combinations of the above methods to connect the connector with at least one PCB 402, 404, two or more PCBs 402, 404, or other suitable components.

In an aspect, an integrated connector 100 is configured according to the following method. An outer member 200 having wall thickness t and defining a first bore 202 of diameter $D_B$, and an inner member 300 of diameter $D_I$ are provided, where $D_I > D_B$. The outer member 200 is heated to sufficiently high temperatures to expand its diameter to $D_{B1}$, where $D_{B1} > D_I$. The inner member 300 is inserted into the outer member 200 while the outer member's temperature is elevated. Upon insertion of the inner member 104, 300 into the outer member 102, 200 the connector 100 is cooled resulting in a diametrical interference of $\delta = D_I - D_B$. This shrinkage is utilized to maintain mechanical and electrical contact between the members 102, 104. The wall thickness and other geometrical variables are chosen to maintain stress levels of each component remain below specified values.

For example, $P_I$, the pressure exerted on the outer member 102 by the inner member 104, and, $P_O$, the pressure exerted by the outer member 102 on the inner member 104 should be equal to satisfy equilibrium. Also the interface radius b should be common for both members 102, 104 post press or shrink processes. Similarly, all respective stresses should be below the respective yield stress of the material(s) of each member 102, 104.

Thus, for a connector 100 where the inner radius, i.e. the radius of the interface between the outer 102 and inner 104, members is b and the outer radius, i.e. the radius of the outer member 104 surrounding the interface between the inner member 104 and the outer member 104, is c and where $\sigma_r$ and $\sigma_\theta$ respectively represent the radial and angular stresses at a respective location:

The stresses at the inner surface of the outer member r=b are:

$$\sigma_r = P_I \text{ and } \sigma_\theta = P_I \frac{c^2 + b^2}{c^2 - b^2}$$

The stresses at the outer surface of the outer member r=c are:

$$\sigma_r = 0 \text{ and } \sigma_\theta = P_I \frac{2b}{c^2 - b^2}$$

The stresses at the outer surface of the inner member r=b are:

$\sigma_r = P_O$ and $\sigma_\theta = P_O$

The stresses at the center of the inner member r=0 are:

$\sigma_r = 0$ and $\sigma_\theta = 2P_O$

Accordingly, if the inner member and the outer member comprise different materials the pressure the pressure P is:

$$P = P_O = P_I = \frac{\delta}{b\left[\frac{1}{E_O}\left(\frac{c^2 + b^2}{c^2 - b^2} + v_O\right) + \frac{1}{E_I}(1 - v_I)\right]}$$

where:
P is the press or shrink pressure;
$P_O$ is the pressure of the outer member on the inner member;
$P_I$ is the pressure of the inner member on the outer member;
$E_O$ is the Modulus of Elasticity of the material of the outer member;
$E_I$ is the Modulus of Elasticity of the material. of the inner member;
b is the outer radius of the inner member and the inner radius of the outer member;
c is the outer radius of the outer member;
$v_O$ is the Poisson's ratio of the material of the outer member;
$v_I$ is the Poisson's ratio of the material of the inner member.

Those skilled in the art will recognize that a wide variety of modifications, alterations, and combinations can be made with respect to the described embodiments without departing from the spirit and scope of the invention, and that such modifications, alterations, and combinations are to be viewed as being within the scope of the invention. Further, those skilled in the art will recognize that the approaches described herein may also be used to design components and devices other than those listed above.

The invention claimed is:

1. A circuit connector comprising: an outer member defining a first bore; and an inner member at least partially disposed within the first bore; wherein the inner member is in an interference fit relationship with the outer member at the periphery of the first bore; wherein the outer member defines a second bore, the second bore being at least partially non-overlapping with the first bore; wherein the outer member is configured to receive solder in the second bore; wherein the inner member comprises an electric conductor; wherein the electric conductor comprises an electrically conductive outer plating layer.

2. The connector as described in claim 1 wherein the outer member comprises a first substantially cylindrical section.

3. The connector as described in claim 2 wherein the wherein the first substantially cylindrical section has an annular cross-section.

4. The connector as described in claim 1 wherein the outer member comprises a second substantially cylindrical section with an annular cross section, the second substantially cylindrical section defining the second bore.

5. The connector as described in claim 1 wherein the inner member comprises a third substantially cylindrical section.

6. The connector as described in claim 5, wherein the third cylindrical section has a disc cross section.

7. The connector as described in claim 1, wherein the electric conductor comprises copper.

8. The connector as described in claim 1 wherein the outer member comprises a thermal conductor.

9. The connector as described in claim 8 wherein the thermal conductor is steel.

10. The connector as described in claim 8 wherein the inner member is tapered at least one end.

11. The connector as described in claim 8 wherein the inner member is configured to engage with a printed circuit board.

12. A method of connecting circuits comprising: providing a printed circuit board; providing a connector, the connector comprising an outer member defining a first bore, and an inner member at least partially disposed within the first bore wherein the inner member is in an interference fit relationship with the outer member at the periphery of the first bore and wherein the inner member is an electric conductor; mechanically and electrically connecting the connector to the printed circuit board; wherein the outer member defines a second bore, the second bore being at least partially non-overlapping with the first bore; wherein the outer member is configured to receive solder in the second bore; wherein the inner member comprises an electric conductor; wherein the electric conductor comprises an electrically conductive outer plating layer.

13. The method of connecting circuits as described in claim 12 wherein the connecting comprises pressing the connector at least partially into the printed circuit board.

14. The method of connecting circuits as described in claim 12 wherein the connecting comprises applying solder paste to one of the connector and the printed circuit board;
disposing the connector about the printed circuit board to facilitate soldering of the connector to the circuit board by solder reflow;
reflowing the solder paste.

15. The method of connecting circuits as described in claim 12 wherein the connecting comprises inserting the connector at least partially into a bore in the printed circuit board; and
wave soldering the connector to the printed circuit board.

16. An printed circuit board assembly comprising: a first and a second printed circuit board; and a connector comprising an outer member defining a first bore, and an inner member at least partially disposed within the first bore wherein the inner member is in an interference fit relationship with the outer member at the periphery of the first bore and wherein the inner member is an electric conductor; the connector being mechanically and electrically connected to each printed circuit board by at least one of solder reflow, wave soldering and press fitting; wherein the outer member defines a second bore, the second bore being at least partially non-overlapping with the first bore; wherein the outer member is configured to receive solder in the second bore; wherein the inner member comprises an electric conductor; wherein the electric conductor comprises an electrically conductive outer plating layer.

17. The printed circuit board assembly as described in claim 16 wherein the outer member comprises a thermal conductor.

* * * * *